United States Patent [19]

Mays

[11] Patent Number: 5,581,118
[45] Date of Patent: Dec. 3, 1996

[54] ELECTRONIC SURFACE MOUNT DEVICE

[75] Inventor: Lonne L. Mays, Gilbert, Ariz.

[73] Assignee: Motorola, Inc., Schaumburg, Ill.

[21] Appl. No.: 493,945

[22] Filed: Jun. 23, 1995

Related U.S. Application Data

[63] Continuation of Ser. No. 251,433, May 31, 1994, abandoned.

[51] Int. Cl.$^6$ .......................... H01L 23/495; H01L 23/48
[52] U.S. Cl. .......................... 257/666; 257/675; 257/676; 257/696; 257/672
[58] Field of Search .............................. 257/666, 668, 257/675, 676, 696, 707, 672, 712, 714, 718, 719, 796, 787

[56] References Cited

U.S. PATENT DOCUMENTS

| | | | |
|---|---|---|---|
| 4,095,253 | 6/1978 | Yoshimura et al. | 257/796 |
| 4,100,566 | 7/1978 | Okikawa et al. | 257/796 |
| 4,270,138 | 5/1981 | Desmond | 257/796 |
| 4,542,439 | 9/1985 | Dick | 361/405 |
| 4,589,010 | 5/1986 | Tateno et al. | 257/666 |
| 4,647,959 | 3/1987 | Smith | 257/684 |
| 4,712,127 | 12/1987 | Colombo et al. | 257/796 |
| 4,971,196 | 11/1990 | Kitamura et al. | 206/328 |
| 5,018,005 | 5/1991 | Lin et al. | 257/666 |
| 5,095,626 | 3/1992 | Kitamura et al. | 29/827 |
| 5,305,179 | 4/1994 | Sono et al. | 257/796 |

FOREIGN PATENT DOCUMENTS

| | | |
|---|---|---|
| 0208911 | 1/1987 | European Pat. Off. . |

OTHER PUBLICATIONS

Motorola, Inc., TO–220 Leadform Options, 1990, Publication No. BR370/D, Rev 2.
Motorola, Inc., Rectifier Applications Handbook, 1993, Publication No. HB2145/D, pp. 280–283.

Primary Examiner—Mahshid Saadat
Assistant Examiner—Jhihan Clark
Attorney, Agent, or Firm—Aaron B. Bernstein; George C. Chen

[57] ABSTRACT

A surface mount package (10) includes a leadframe (14) facing away from the mounting surface such that the primary heat path is away from the mounting surface. The package may be a modified TO-220, wherein the tab (16) of the leadframe is bent down toward the mounting surface, and the leads (20) are bent down and under the package. Such an embodiment provides for a small footprint and is relatively easy to manufacture.

18 Claims, 2 Drawing Sheets

ELECTRONIC SURFACE MOUNT DEVICE

This application is a continuation of prior application Ser. No. 08/251,433, filed May 31, 1994, now abandoned.

FIELD OF THE INVENTION

The present invention relates, in general, to semiconductor devices, and more particularly, to semiconductor packages.

BACKGROUND OF THE INVENTION

In the electronics industry, electronic components are typically assembled by laying out electronic packages on a printed circuit board. The electronic packages conventionally available give rise to particular disadvantages. For example, conventional electronic packages have the contained semiconductor device attached to a metal leadframe. The leadframe often faces the circuit board when mounted. Consequently, the heat which must be dissipated from the semiconductor die must pass through the leadframe into the circuit board. It will be well understood that it is particularly difficult to dissipate or distribute heat via the printed circuit board.

Additionally, power semiconductor packages conventionally available have a significant "footprint" which takes up an inordinate amount of space on the circuit board, thus limiting component packing density. For example, many conventional power semiconductor packages have a tab portion of the leadframe which extends from the leadframe out past the perimeter of the molded portion of the package. This extending tab, although a heat dissipater, consumes significant space on the printed circuit board. In the past, in an effort to reduce footprint size, the size of the leadframe has been reduced. However this reduces the amount of metal mass available for absorbing and distributing energy, which in turn, limits the power and current surge capacity of the package (an important consideration in surge suppression or current surge applications).

Furthermore, the leadframe of many conventional semiconductor packages directly contacts the printed circuit board. Such a package configuration precludes the use of wave soldering. This is because the wave soldering process typically requires a non-metal portion contacting the board so that portion can be glued to the board during the soldering.

Consequently it is desirable to have a semiconductor device package that does not have the primary heat path into the circuit board, that does not have a large footprint, is compatible with all assembly reflow processes including wave soldering, and does not have limited metal mass available for absorbing and distributing energy.

SUMMARY OF THE INVENTION

Briefly stated, the present invention provides a surface mount device package comprising a first exterior surface and a second exterior surface opposite and parallel to the first exterior surface. A rigid metal leadframe having an extending tab is positioned flush with the first exterior surface. Furthermore, the surface mount device package is mountable for operation in the direction of the second exterior surface.

DETAILED DESCRIPTION OF THE DRAWINGS

According to one embodiment of the present invention, an electronic surface mount package is provided by modifying a molded electronic device package having an exposed leadframe with an extending tab and electrical leads. In the preferred embodiment, the molded electronic device package that is modified is a TO-220. The extending tab and the leads of the TO-220 are bent, in a manner explained in detail below, to provide for surface mounting where the exposed leadframe is opposite the mounting surface. Since the semiconductor die is mounted to the leadframe, and the leadframe is opposite the mounting surface, this embodiment of the present invention provides a heat path away from the circuit board and into free air. Furthermore, a heatsink can be conveniently attached to the exposed leadframe, providing even more effective heat dissipation.

Figure 1:
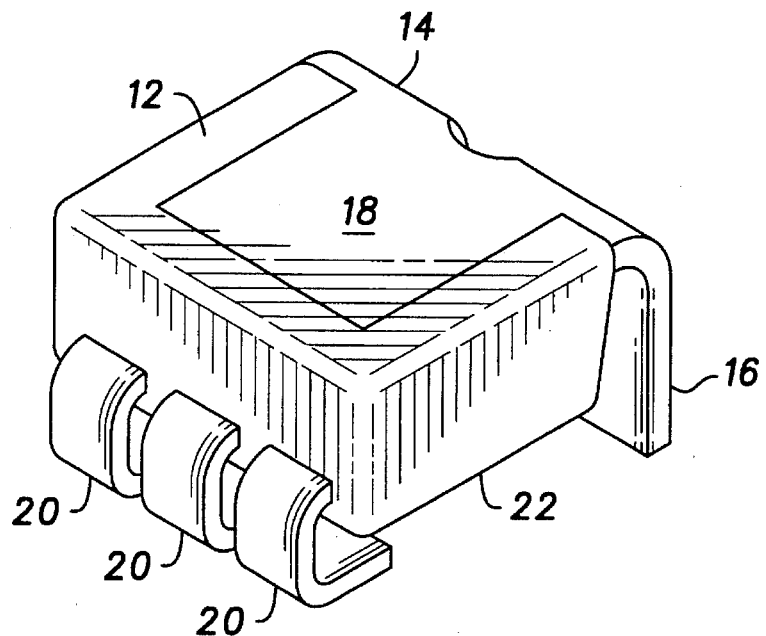
FIG. 1 is a perspective view representative of an electronic surface mount package.

Turning now to the figures for a more detailed description of the preferred embodiment of the present invention, FIG. 1 is a perspective view of a representative electronic surface mount package. FIG. 1 shows an electronic surface mount package 10. In this embodiment, the electronic surface mount package 10 comprises a modified TO-220 package. In the discussed embodiment, the modifications include bending a right angle into the tab portion of the leadframe, and bending the leads of the package in the same direction as the bent tab. The package 10 has a first exterior surface 12. The first exterior surface 12 is the "top" of the surface mount device. That is to say, the first exterior surface 12 faces away from the printed circuit board when the device is put into place. Package 10 also comprises second exterior surface 22 (hidden in FIG. 1, but shown in other FIGS.) which is opposite and parallel to first exterior surface 12.

The first exterior surface 12 exposes exposed leadframe portion 14. Exposed leadframe portion 14 is a rigid metal leadframe having an integral extending tab 16. As will be recognized by those of ordinary skill in the art, the leadframe of the molded electronic package 10 is a modified version of the standard leadframe of a TO-220 package. Therefore, it will be recognized that package 10 has a flag portion 18 to which an electronic device comprising a semiconductor die is attached (within the package). Package 10 also has an integral extending tab 16. Additionally, as will be recognized by those of ordinary skill, the leadframe of the package includes a plurality of electrical leads 20. As will be understood, all parts of the leadframe, including leads 20, flag 18 and tab 16 are initially all part of the same stamped metal leadframe, prior to manufacturing of the package.

Figure 2:
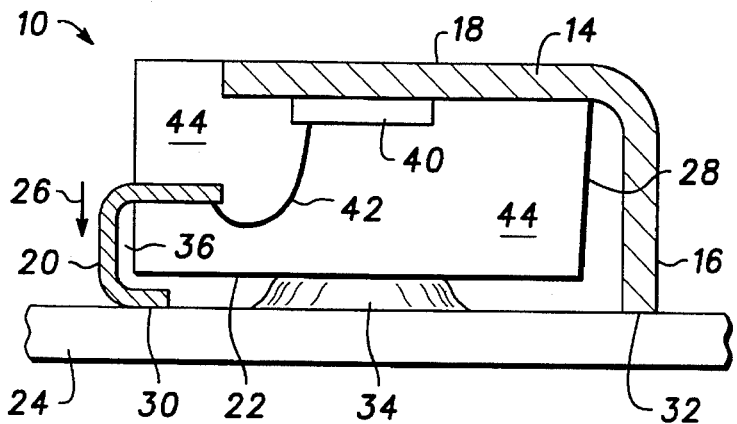
FIG. 2 is a cross section side view of a representative electronic surface mount package attached to a circuit board.

Turning to FIG. 2, FIG. 2 is a cross section side view showing an electronic surface mount package in accordance with the present invention, mounted to a circuit board 24. FIG. 2 illustrates, particularly well, certain features of this embodiment. More specifically, FIG. 2 illustrates that the electrical leads 20 are bent in a first direction indicated by arrow 26, and then under the package, parallel to second exterior surface 22. Additionally, the extending tab 16 of exposed leadframe 14 is bent downward, toward second surface 22, along a third side 28. Bending the extending tab 16 downward provides a smaller footprint compared to a conventional TO-220, while maintaining a large metal mass, improving energy absorption and distribution capability.

Leads 20 have a portion 30 which is parallel to the second exterior surface 22, as discussed above. It can be seen that portions 30 of leads 20 are coplanar to an edge 32 of tab 16.

It will be recognized, that since lead portions 30 lie in the same plane as tab edge 32, the device is now configured for surface mounting in the direction of its mounting side which is the second exterior surface 22. In one practical application, package 10 may be attached to circuit board 24 with a dab of adhesive 34, and subsequently wave soldered so as to electrically attach leads 20 and edge 32 of tab 16 to the circuit board 24. One notable feature of leads 20 is that, as configured in this embodiment, there exists a gap 36 between leads 20 and the side of package 10. Such a configuration provides certain manufacturing advantages, including reduced stress transferred to the portion of the leads inside the package. Additionally, with regard to the illustrated configuration of leads 20, it should be noted that portions 30 of leads 20 are adjacent to the second exterior surface 22. This configuration further reduces the footprint of the package, which is desirable. It will be understood, however, that other lead configurations may be appropriate for different applications.

Those of ordinary skill in the art will recognized certain features of the cross section of FIG. 2, namely semiconductor die 40 attached in well known fashions to the flag portion 18 of the leadframe. In certain embodiments, semiconductor device 40 may comprise a thyristor, a transistor, a diode or other discrete power devices. Additionally, certain embodiments in accordance with the present invention may be appropriate for entirely different kinds of devices, including analog regulators and digital devices.

Additionally, as will be recognized by those of ordinary skill in the art, semiconductor die 40 is electrically connected to leads 20, and thereby to the circuit board 24 and other associated components not shown, via wire bonds represented by bond 42. It will also be understood that die 40, the internal portions of leads 20, wire bond 42, and any other features interior to the package are encapsulated, according to well known methods, with an encapsulating material 44.

Figure 3:
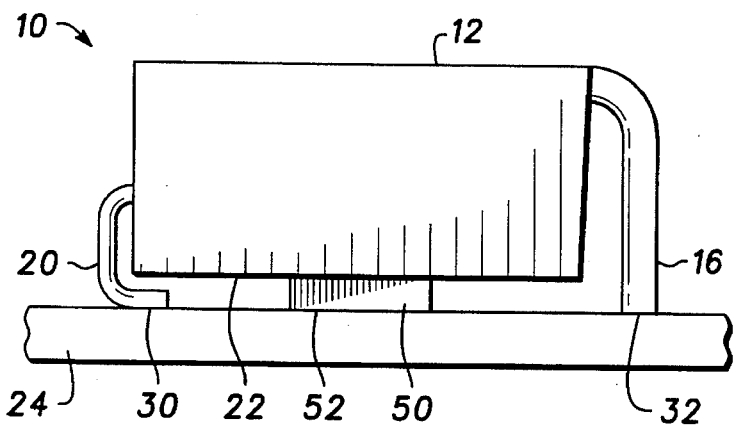
FIG. 3 is a side view of an alternate electronic surface mount package attached to a circuit board.

FIG. 3 is a side view of an alternate embodiment of an electronic surface mount package in accordance with the present invention. One notable distinction between the embodiment shown in FIG. 3 and the earlier discussed embodiments is the protrusion 50 which extends away from second exterior surface (mounting side) 22, in a direction away from the first exterior surface 12. The protrusion 50 has a bottom surface 52 coplanar to lead portions 30 and edge 32 of the extended tab 16. This embodiment can be manufactured by modifying the standard TO-220 mold to create the protrusion 50. The protrusion 50 allows for the surface mount package 10 to be adhesively mounted with a very thin layer of adhesive.

Figure 4:
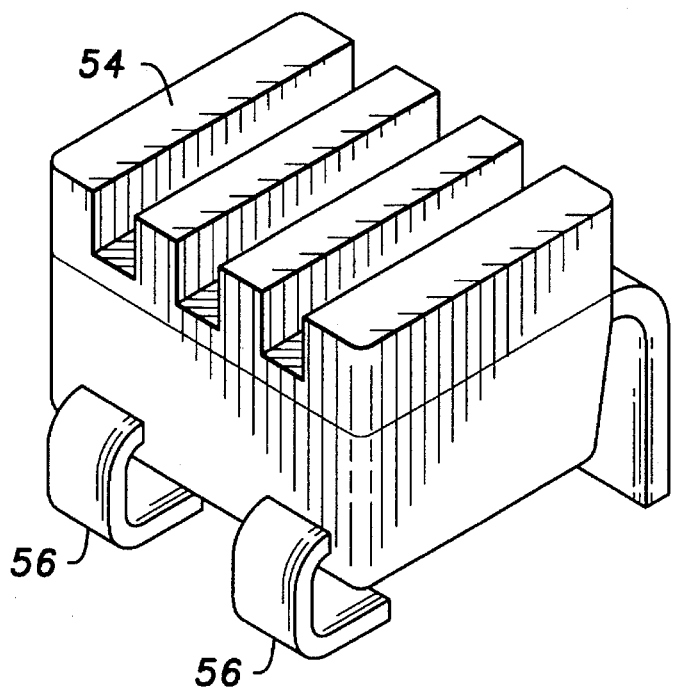
FIG. 4 is a perspective view of an alternative electronic surface mount package.

FIG. 4 shows an alternate embodiment of electronic surface mount package 10. One distinction between this embodiment of the electronic surface mount package 10 and previous embodiments is the addition of heatsink 54 mounted directly upon the exposed leadframe 16 (which can be seen in FIG. 1, but is hidden in FIG. 4). It will be recognized that the mounting of the heatsink 54 directly upon the leadframe 16 provides a desirable heat path up and away from the circuit board upon which the package is mounted. Another distinctive feature of the embodiment shown in FIG. 4 is that it has two electrical leads 56 as opposed to three leads 20 shown in FIG. 1.

Figure 5:
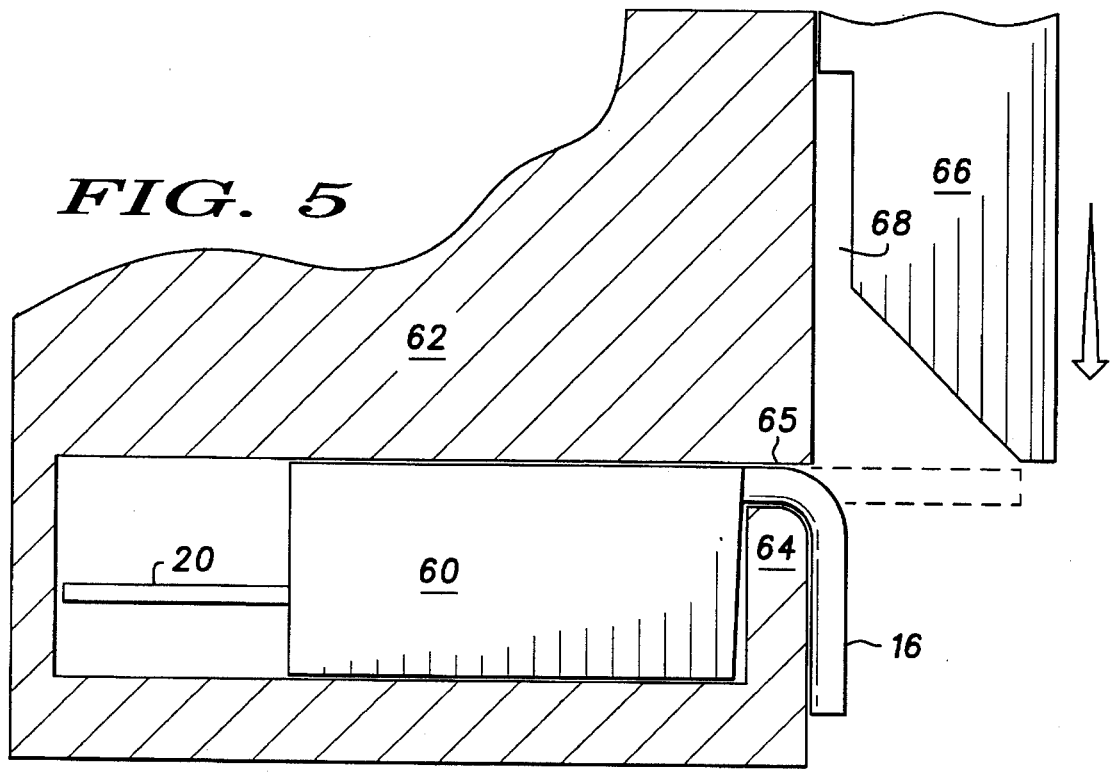
FIG. 5 is a side view representing an apparatus used for making an electronic surface mount package.

FIG. 5 shows an apparatus for modifying a TO-220 in a form in accordance with an embodiment of the present invention. A TO-220 60 is inserted into a fixture 62. The fixture 62 has a portion 64 around which the extending tab 16 is to be bent. A tool 66 has a polished and beveled surface such that at the beginning of its travel it contacts the extended tab 16 at its outermost end and progressively pushes the tab 16 down and bending the tab 16 around the portion 64. The tool 66 has a slot 68 that has a thickness equal to the thickness of the extending tab 16. In place of the beveled polished surface, tool 66 could utilize a wide roller bearing to contact and bend the tab 16 down around the portion 64. Additionally, fixture 62 could be articulated such that clamping force is brought to bear between portion 64 and surface 65 of fixture 62, thus precluding the transfer of forces to the interior of the molded portion of the package containing the die. It will be recognized that the bending of the tab 16 could be accomplished in many other ways. However, in all cases, care must be taken to minimize mechanical shock transferred to the package and the semiconductor die within the package.

It will also be understood that a variety of methods may be used to shorten and bend the leads 20 in order to achieve certain embodiments of the present invention. A preferred embodiment includes a progressive die which achieves configuration shown in FIG. 2, including the gap 36. More specifically, a first die bends the leads downward along the first direction 26 and a second die bends the leads along the second (bottom) exterior surface 22.

By now it should be appreciated that an electronic surface mount package has been described that provides the advantages of a small footprint, a heat path extending up and away from any circuit board upon which it is mounted, a substantial metal mass which provides superior energy absorption and distribution, and a package which is suitable for all assembly reflow processes including wave soldering. Another advantage is that one embodiment comprises a modification of an existing TO-220, providing economical manufacture.

While the invention has been particularly shown and described with reference to preferred embodiments, it will be understood by those skilled in the art that changes in form and detail may be made without departing from the spirit and scope of the invention.

I claim:

1. A surface mount device package comprising:

a first exterior surface;

a second exterior surface opposite and parallel to the first exterior surface;

a third exterior surface connecting the first exterior surface to the second exterior surface;

a rigid metal leadframe having an extending tab, wherein the rigid metal leadframe forms at least a portion of the first exterior surface, wherein the surface mount device package is mountable on the second exterior surface and wherein electrical coupling of the surface mount device package occurs along the second exterior surface.

2. The package of claim 1, wherein the extending tab is bent toward the second exterior surface along the third exterior surface.

3. The package of claim 1, further comprising a protrusion extending from the second exterior surface, away from the first exterior surface, the protrusion having a bottom surface substantially coplanar to a plurality of leads.

4. The package of claim 1, further comprising a heatsink attached to the rigid metal leadframe.

5. The surface mount device package of claim 1 further comprising a circuit board electrically coupled to the surface mount device package along the second exterior surface.

6. The package of claim 2, further comprising a plurality of electrical leads parallel to the second exterior surface and coplanar to an edge of the extending tab.

7. The package of claim 6, wherein at least one of the electrical leads is adjacent the second exterior surface.

8. The package of claim 6, wherein the electrical surface mount device package is a modified TO-220..

9. An electronic surface mount device package comprising:
   a molded package with a first side, a second side, and a mounting side, wherein the second side connects the first side to the mounting side;
   an exposed leadframe having an extending tab, the exposed leadframe being exposed along the first side of the molded package and the extending tab being bent along the second side of the molded package in a direction toward the mounting side, wherein electrical coupling of the electronic surface mount device package occurs along the mounting side of the molded package; and
   a plurality of leads lying in a plane parallel to the mounting side of the molded package.

10. The package of claim 9, wherein the extending tab comprises an edge coplanar to the leads.

11. The package of claim 9, wherein the leads are adjacent to the mounting side.

12. The package of claim 9, wherein the electronic surface mount device package comprises a modified TO-220.

13. The package of claim 9, further comprising a heatsink attached to the exposed leadframe.

14. The package of claim 9, wherein the electronic surface mount device package contains a thyristor.

15. The package of claim 9, wherein the electronic surface mount device package contains a transistor.

16. The package of claim 9, wherein the electronic surface mount device package contains a diode.

17. The package of claim 9, wherein the electronic surface mount device package contains an analog regulator.

18. The electronic surface mount device package of claim 9 further comprising a circuit board adjacent to the mounting side of the molded package wherein the plurality of leads are electrically coupled to the circuit board.

* * * * *